(12) United States Patent
Liu et al.

(10) Patent No.: US 10,910,042 B2
(45) Date of Patent: Feb. 2, 2021

(54) CIRCUIT STRUCTURE FOR OBTAINING CRITICAL WORD LINE VOLTAGE

(71) Applicant: Shanghai Huali Integrated Circuit Mfg. Co., Ltd., Shanghai (CN)

(72) Inventors: Wen Liu, Shanghai (CN); Hongjin He, Shanghai (CN)

( * ) Notice: Subject to any disclaimer, the term of this patent is extended or adjusted under 35 U.S.C. 154(b) by 0 days.

(21) Appl. No.: 16/655,253

(22) Filed: Oct. 17, 2019

(65) Prior Publication Data
US 2020/0194062 A1    Jun. 18, 2020

(51) Int. Cl.
*G11C 11/419*    (2006.01)
*G06F 30/30*    (2020.01)
*G11C 11/418*    (2006.01)

(52) U.S. Cl.
CPC .......... *G11C 11/419* (2013.01); *G06F 30/30* (2020.01); *G11C 11/418* (2013.01)

(58) Field of Classification Search
CPC ...... G11C 11/419; G11C 11/418; G06F 30/30
USPC ......................................................... 365/154
See application file for complete search history.

(56) References Cited

U.S. PATENT DOCUMENTS

| | | | | |
|---|---|---|---|---|
| 5,936,892 A * | 8/1999 | Wendell | .............. | G11C 7/065 365/156 |
| 2002/0051379 A1* | 5/2002 | Deng | .............. | G11C 11/412 365/154 |
| 2012/0063210 A1* | 3/2012 | Hirabayashi | .......... | G11C 11/412 365/154 |
| 2012/0230130 A1* | 9/2012 | Sheppard | ................. | G11C 8/14 365/189.011 |
| 2013/0163357 A1* | 6/2013 | Buer | ..................... | G11C 11/417 365/201 |
| 2017/0316820 A1* | 11/2017 | Kumar | ................... | G11C 5/147 |
| 2017/0372793 A1* | 12/2017 | Walker | ................... | G11C 29/46 |
| 2018/0287592 A1* | 10/2018 | Cho | ....................... | G06F 1/3275 |
| 2019/0164596 A1* | 5/2019 | Lee | ........................ | G11C 5/147 |

* cited by examiner

*Primary Examiner* — Sung Il Cho
(74) *Attorney, Agent, or Firm* — Kilpatrick Townsend & Stockton, LLP (57) ABSTRACT

The present disclosure discloses a circuit structure. The circuit structure comprises: a redundant memory device for simulating a read operation of the memory cell in response to the driving of the test word line voltage; a decision device connected to the internal node of the redundant memory device for determining whether the test word line voltage causes the internal node of the redundant memory device to reverse during the read operation in response to the read operation. In response to the reversal, the redundant memory device simulates the read operation with the adjusted test word line voltage until the determination device determines that the internal node does not reverse during the read operation. The circuit structure also comprises: a statistics device for counting and outputting the number of reversals, which is used to characterize the critical word line voltage in conjunction with each adjustment of the test word line voltage.

9 Claims, 7 Drawing Sheets

CIRCUIT STRUCTURE FOR OBTAINING CRITICAL WORD LINE VOLTAGE

CROSS-REFERENCES TO RELATED APPLICATIONS

The present application claims priority to Chinese Patent Application No. 201811518666.0, filed on Dec. 12, 2018, entitled "CIRCUIT STRUCTURE", which is incorporated by reference herein for all purposes.

FIELD

The present disclosure relates to the field of chip design, and more particularly to a circuit structure for the word line voltage sensor applied in an adjustable word-line underdrive (WLUD) read auxiliary circuit.

BACKGROUND

Figure 1:
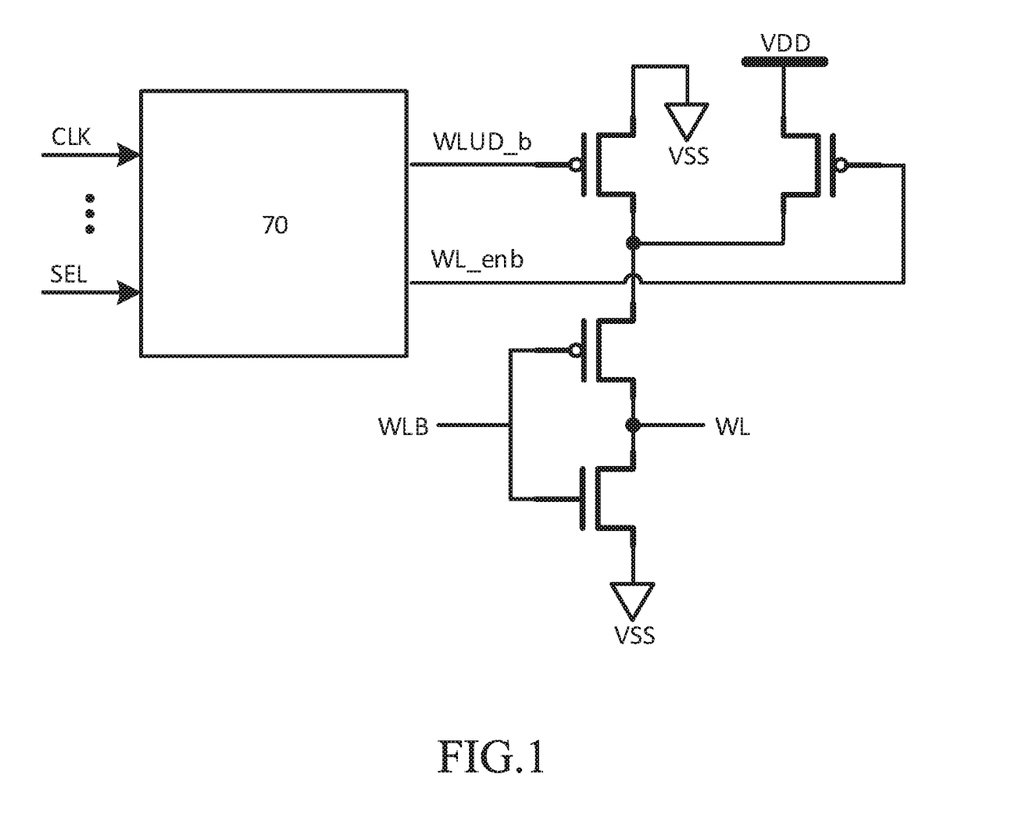
FIG. 1 shows a WLUD read/write auxiliary circuit of the prior art.

The circuit structure of a conventional WLUD read/write auxiliary circuit applied to a static random access memory (SRAM) is shown in FIG. 1. The controller device in the conventional circuit structure mainly uses timing logic to provide a gate enable signal for a PMOS transistor connected to a power source, and a gate switch signal for a grounded PMOS transistor.

The controller device of the prior art can only reduce the word line (WL) voltage through the voltage division between the grounded PMOS transistor and the PMOS transistor connected to the power source, but cannot determine whether the WLUD needs to be performed, or determine the gear of the WLUD by detecting whether the internal node of the SRAM memory cell has a read flip.

The first of the shortcomings of the prior art is that the internal node of the SRAM memory cell cannot be tracked. If the generated WLUD signal is too low, the read/write speed is thereby limited, and the performance of the SRAM is thereby sacrificed. If the generated WLUD signal is too high, the yield of the SRAM memory cell cannot be effectively improved thereby.

The second of the shortcomings of the prior art is that the WLUD voltage has only one value. If the internal node of the SRAM memory cell still read flips at the value, the WLUD circuit cannot be adjusted. Therefore, the adjustability of the prior art is poor. In the case of the WLUD failure, the ability to improve the yield will also be invalid.

Therefore, there is a need in the art for a circuit structure for the word line voltage sensor applied in an adjustable WLUD read/write auxiliary circuit to effectively determine whether the word line voltage is required to be reduced to drive the SRAM memory cell, and obtain the reduced critical word line voltage that make the SRAM operate at the best state.

SUMMARY

A brief overview of one or more aspects is provided below to provide a basic understanding of these aspects. The summary is not an extensive overview of all of the aspects that are contemplated, and is not intended to identify key or decisive elements in all aspects. The sole purpose of the summary is to present some concepts of one or more aspects in a simplified form as a prelude to the more detailed description that is presented later.

In order to solve the problems existing in the prior art, the present disclosure provides a circuit structure for the word line voltage sensor applied in an adjustable WLUD read/write auxiliary circuit for obtaining the critical word line voltage to stabilize the internal node of the SRAM memory cell during read operations.

The circuit structure provided by the present disclosure may comprise a redundant memory device, a decision device and a statistics device.

The redundant memory device is configured to simulate the read operation of the SRAM memory cell in response to the driving of a test word line voltage.

The decision device is connected to an internal node of the redundant memory device, and configured to determine whether the test word line voltage causes the reversal of the internal node of the redundant memory device during the read operation according to the read operation. In response to the reversal, the redundant memory device simulates the read operation with adjusted test word line voltage until the decision device determines that the internal node does not reverse during the read operation.

The statistics device is configured to count and output the number of reversals. The number of reversals is used to characterize the critical word line voltage in conjunction with each adjustment of the test word line voltage.

As the circuit structure described above, the redundant memory device may comprise a plurality of redundant memory units. Each of the redundant memory units comprises electrical components that replicate the electrical components comprised in the SRAM memory cell. The connection relationship of the electrical components comprised in the redundant memory unit is different from the connection relationship of the electrical components comprised in the SRAM memory cell. The internal node of the redundant memory device feeds back the average state of the internal nodes comprised in the redundant memory units.

As the circuit structure described above, each of the redundant memory units may comprise a first gate transistor, a first pull-up transistor, a first pull-down transistor, a second gate transistor, a second pull-up transistor and a second pull-down transistor, which are connected between a first bit line and a second bit line.

The drains of the first pull-up transistor and the first pull-down transistor are connected to the source of the first gate transistor to lead out the internal node of the redundant memory unit.

The gates of the first gate transistor and the second gate transistor are connected to the word line for responding to the driving of the test word line voltage that is preset.

The drain of the first gate transistor is connected to the first bit line. The drain of the second gate transistor is connected to the second bit line. The first bit line and the second bit line are connected to a high level.

The gate and the source of the first pull-up transistor, the gate of the first pull-down transistor, the source and the drain of the second pull-up transistor, and the drain of the second pull-down transistor are connected to a power source.

The source of the first pull-down transistor, the gate of the second pull-up transistor, and the gate and the source of the second pull-down transistor are grounded.

As the circuit structure described above, each of the redundant memory units may also comprise a first gate transistor, a first pull-up transistor, a first pull-down transistor, a second gate transistor, a second pull-up transistor and a second pull-down transistor which are connected between a first bit line and a second bit line.

The drains of the first pull-up transistor and the first pull-down transistor, the gates of the second pull-up transistor and the second pull-down transistor are connected to the source of the first gate transistor to lead out the internal node of the redundant memory unit.

The gate of the first gate transistor is connected to the word line for responding to the driving of the test word line voltage that is preset.

The sources of the first pull-up transistor and the second pull-up transistor are connected to a power source. The sources of the first pull-down transistor and the second pull-down transistor are grounded.

The drain of the first gate transistor is connected to the first bit line. The drain of the second gate transistor is connected to the second bit line. The first bit line and the second bit line are connected to a high level.

The gates of the first pull-up transistor and the first pull-down transistor, and the drains of the second pull-up transistor and the second pull-down transistor are connected to the source of the second gate transistor, and are further connected to a constant high signal.

The gate of the second gate transistor is connected to a constant low signal.

As the circuit structure described above, the decision device may comprise inverter and NAND gate. The P:N ratio of the inverter is less than or equal to 2:1. The input of the inverter is connected to the internal node. The output of the inverter is connected to the first input of the NAND gate. In response to receiving the determination reference signal on the second input of the NAND gate, the output of the NAND gate outputs a determination result to the statistics device, so that the statistics device can count the reversals based on the determination result.

As the circuit structure described above, the decision device may further comprise a combination of a plurality of inverters and a plurality of NAND gates. The P:N ratios of the inverters are different. The inputs of the inverters are connected to the internal node. The output of each inverter is connected to the first input of the corresponding NAND gate. The second inputs of the NAND gates are configured to receive the determination reference signal. In response to receiving the determination reference signal on one of the NAND gates, the output of the NAND gate outputs a determination result.

As the circuit structure described above, the circuit structure may also comprise a plurality of redundant memory devices and a plurality of decision devices. Each of the redundant memory devices corresponds to one of the decision devices.

The redundant memory devices emulate the read operation of the SRAM memory cell.

The decision devices output a plurality of determination results as to whether reversals occur.

The circuit structure may further comprise a decision logic device for receiving the determination results. In response to any one of the determination results determining that the internal node is reversed, the decision logic device outputs a determination signal of the reversal to the statistics device. The number of reversals is characterized by the number of occurrences of the determination signal of the reversals.

As the circuit structure described above, the statistics device may be a shift register sequential circuit consisting of a plurality of D flip-flops. Each time the decision device determining the reversals, the shift register sequential circuit sequentially shifts from low bit to high bit until the decision device determines that the internal node does not reverse, and then outputs the number of reversals.

As the circuit structure described above, the circuit structure may further comprise a debounce device. The debounce device comprises a delay unit and a logic unit, and is connected between the decision device and the statistics device to filter out the noise signal output by the decision device.

As the circuit structure described above, the circuit structure may further comprise a selection device. The selection device is connected between the decision device and the statistics device, configured to bypass the output result of the decision device, and transmits an external signal input by the selection device to the statistics device in response to the bypass signal. The statistics device counts and outputs the number of reversals according to the external signal.

BRIEF DESCRIPTION OF THE DRAWINGS

The above features and advantages of the present disclosure will be better understood after reading the detailed description of the embodiments of the present disclosure in conjunction with the following figures. In the figures, components are not necessarily drawn to scale, and components having similar related features may have the same or similar reference numerals.

REFERENCE SIGNS 10 redundant memory device
20 decision device
30 debounce device
31 delay unit
40 selection device
50 statistics device
60 decision logic device
70 controller
WLUD_b gate enable signal
WL_enb gate switch signal
WL word line
WLB inverted word line
BP, BN bit line
P, N internal node
VDD power source
VS S ground
CLK, CLOCK time signal
SEL switch control signal
TieH constant high signal TieL constant low signal
VTH determination reference signal
BYPASS bypass signal
BYPASSB inverted bypass signal
RESET reset signal
NPG1, NPG2 NMOS gate transistor
NPD1, NPD2 NMOS pull-down transistor
PPU1, PPU2 PMOS pull-up transistor
D flip-flop
WL_replicate test word line voltage
Vout_SENSOR internal node voltage
DECISION_SIG determination result signal
INNER_DECISION internal determination signal
EXT_DECISION external determination signal
DEC_EN logic determination result signal
DEC_MUX selection result signal

DETAILED DESCRIPTION

The embodiments of the present disclosure are described in the following detailed description. Although the description of the present disclosure will be described in conjunction with the embodiments, this is not a limitation of the present disclosure. On the contrary, the disclosure is described in connection with the embodiments so as to cover other alternatives or modifications that are possible in the embodiments of the present disclosure. In order to provide a thorough understanding of the present disclosure, many specific details are included in the following description. The present disclosure may also be practiced without these details. In addition, some specific details are omitted in the description in order to avoid confusing or obscuring the present disclosure.

In the description of the present disclosure, it should be noted that the terms "installation", "connecting", and "connected" should be understood broadly unless explicitly stated and defined otherwise. For example, the terms "installation", "connecting", and "connected" may be either a fixed connection, a detachable connection, or an integral connection; the terms may be either a mechanical connection or an electrical connection; the terms also may be either a direct connection, an indirect connection through an intermediate medium, or an internal connection between two components.

In addition, "up", "down", "left", "right", "top", "bottom", "horizontal", "vertical" used in the following description shall be understood as the orientation described in the paragraph and shown in the related figure. The relative term is used for convenience of description only, and does not mean that the device described therein is to be manufactured or operated in the specific orientation, and therefore should not be construed as limiting the present disclosure.

Understandably, although the terms "first", "second", "third", etc. may be used to describe various components, regions, layers and/or portions to distinguish different components, regions, layers and/or portions, the order of these components, regions, layers and/or portions described above should not be limited by the terms. Therefore, a first component, region, layer and/or portion mentioned below may be also mentioned as a second component, region, layer and/or portion without departing from some embodiments of the present disclosure.

Although the method is illustrated and described as a series of actions for the purpose of simplifying the explanation, it should be understood and appreciated that these methods are not limited by the order of the actions.

In order to solve the problems existing in the prior art, the present disclosure provides a circuit structure for the word line voltage sensor applied in an adjustable WLUD read/write auxiliary circuit according to an embodiment for obtaining the critical word line voltage to stabilize the internal node of the SRAM memory cell during read operations.

Figure 2:
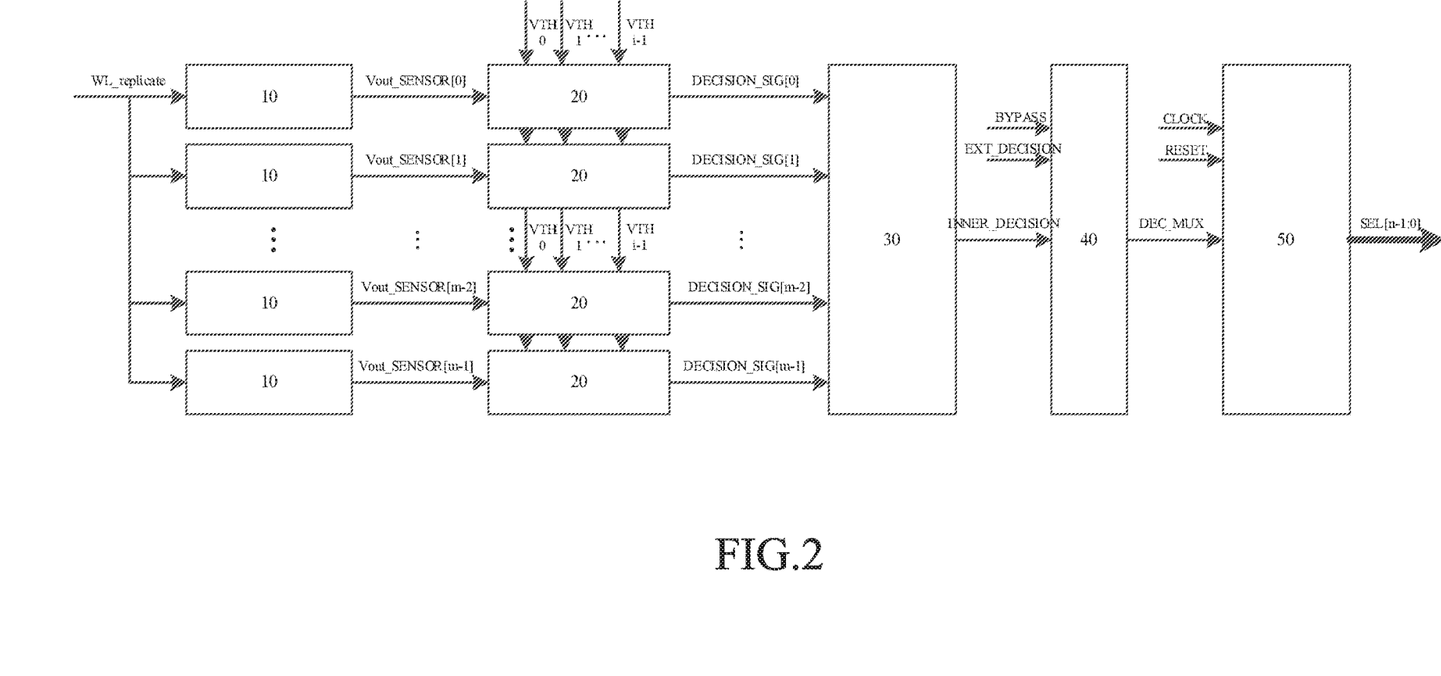
FIG. 2 shows a frame structure of the word line voltage sensor applied to an adjustable WLUD read auxiliary circuit according to an embodiment of the present disclosure.

As shown in FIG. 2, the circuit structure according to the embodiment may comprise at least one redundant memory device 10, at least one decision device 20, a debounce device 30, a selection device 40 and a statistics device 50.

The at least one redundant memory device 10 is configured to simulate the read operation of the SRAM memory cell in response to the driving of the test word line voltage WL_replicate.

Figure 3:
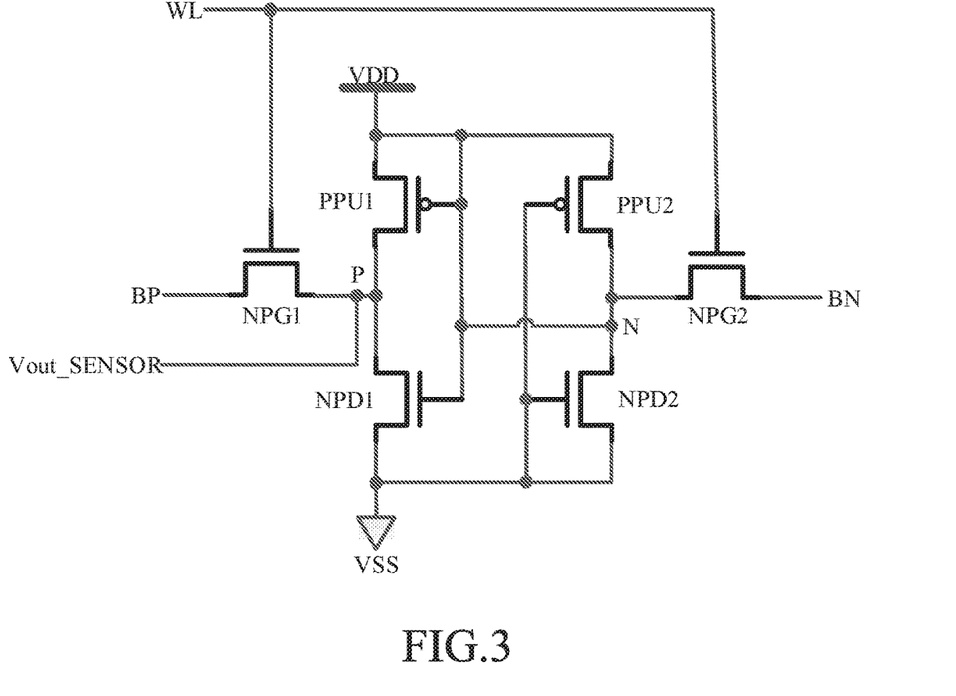
FIG. 3 shows a connection manner of the redundant memory device internally copied from a SRAM memory cell according to an embodiment of the present disclosure.
Figure 4:
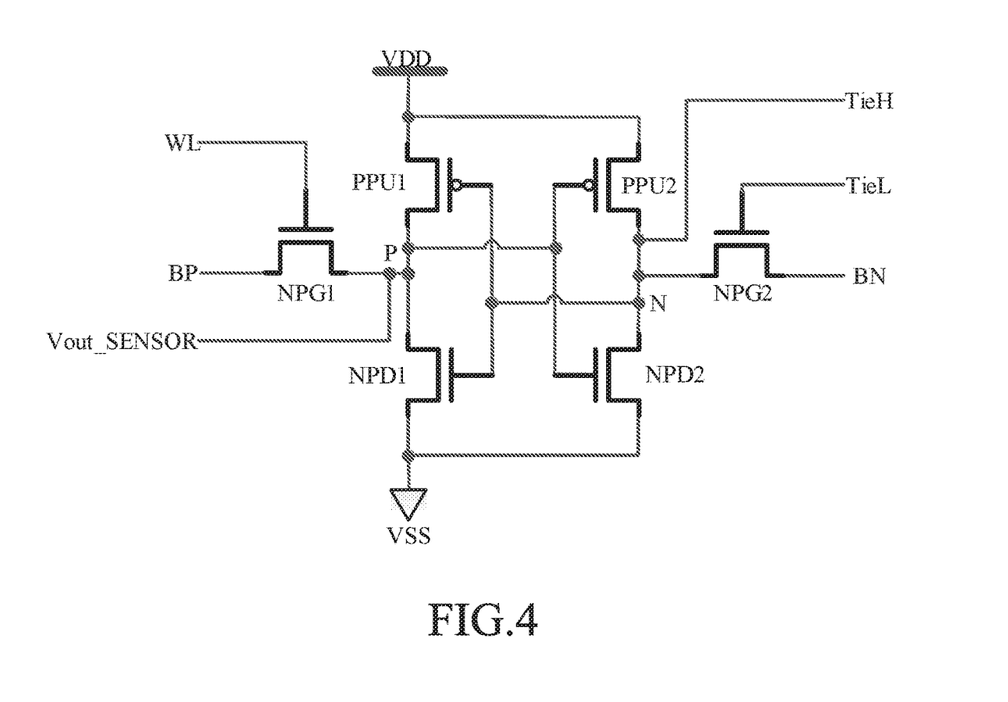
FIG. 4 shows a connection manner of the redundant memory device internally copied from a SRAM memory cell according to an embodiment of the present disclosure.

Each of the redundant memory devices 10 may comprise a plurality of redundant memory units as shown in FIG. 3 or FIG. 4. The number of redundant memory units in each redundant memory device 10 may be determined by the ratio of the rows of the memory array in the SRAM memory cell to the number of redundant memory devices 10.

For example, if the memory array of a certain SRAM memory cell has 512 rows, the redundant memory devices 10 should also totally comprise 512 redundant memory units. Therefore, if 16 redundant memory devices 10 are used to replicate the storage array, each redundant memory device 10 only needs to comprise 32 redundant memory units.

Each redundant memory unit contains electrical components for replicating the electrical components contained in the SRAM memory cell. The size and layout of the redundant memory units may be the same as the SRAM memory cell, but the connection relationship of the electrical components in the redundant memory units should be different from those in the SRAM memory cell to simulate the read operation of the SRAM memory cell.

As seen from the drawing of the connection manner of the redundant memory device internally copied from a SRAM memory cell shown in FIG. 3, each of the redundant memory units may further comprise a first gate transistor NPG1, a first pull-up transistor PPU1, a first pull-down transistor NPD1, a second gate transistor NPG2, a second pull-up transistor PPU2 and a second pull-down transistor NPD2, which are connected between a first bit line BP and a second bit line BN.

The drains of the first pull-up transistor PPU1 and the first pull-down transistor NPD1 are connected to the source of the first gate transistor NPG1 to lead out the internal node P of the redundant memory unit.

The gates of the first gate transistor NPG1 and the second gate transistor NPG2 are connected to the word line WL for responding to the driving of the test word line voltage WL_replicate that is preset.

The drain of the first gate transistor NPG1 is connected to the first bit line BP. The drain of the second gate transistor NPG2 is connected to the second bit line BN. The first bit line BP and the second bit line BN are connected to a high electrical level.

The gate and the source of the first pull-up transistor PPU1, the gate of the first pull-down transistor NPD1, the source and the drain of the second pull-up transistor PPU2, and the drain of the second pull-down transistor NPD2 are connected to a power source.

The source of the first pull-down transistor NPD1, the gate of the second pull-up transistor PPU2, and the gate and the source of the second pull-down transistor NPD2 are grounded.

The internal node P of each redundant memory unit generates a stable voltage signal with the occurrence of the read flip. The voltage signal is used to determine whether the internal node P of the redundant memory unit has a read flip.

Corresponding to the specific embodiment of 32 redundant memory units comprised in each redundant memory device 10, the internal nodes P of the 32 redundant memory units are sequentially connected, thereby generating a total voltage on the internal nodes P of the redundant memory device 10. The voltage on the 32 internal nodes P of the redundant memory device 10 provided in the circuit structure of the embodiment may be normalized, thereby feeding back the average state of the internal nodes P of the 32 redundant memory units.

The normalization process may refer to the method of dividing the total voltage on the 32 internal nodes P by the number of the redundant memory units (i.e. 32) in each redundant storage device 10, thereby obtaining the internal node voltage Vout_SENSOR that feeds back the average state of the internal nodes P of the 32 redundant memory units.

Therefore, the circuit structure according to the embodiment can indirectly detect the voltage of the word line WL applied to the gate of the transmission transistor in the SRAM memory cell by detecting the internal node P voltage Vout_SENSOR, thereby determining whether the downshift of WLUD is required and outputting the switch control signal SEL for the downshift of word line voltage.

In one embodiment, the connection manner of the redundant memory device 10 internally copied from a SRAM memory cell as shown in FIG. 3 is just an embodiment. The main purpose of the embodiment is to minimize the layout modifications from the SRAM memory cell.

In other embodiments, may also adopt the connection manner of the redundant memory device 10 internally copied from a SRAM memory cell as shown in FIG. 4 to determine whether the internal node P of the redundant memory unit has a read flip based on the voltage signal Vout_SENSOR of the internal node P.

Regarding the circuit structure of the present disclosure, FIG. 4 shows that each of the redundant memory units may also comprise a first gate transistor NPG1, a first pull-up transistor PPU1, a first pull-down transistor NPD1, a second gate transistor NPG2, a second pull-up transistor PPU2 and a second pull-down transistor NPD2 which are connected between a first bit line BP and a second bit line BN.

The drains of the first pull-up transistor PPU1 and the first pull-down transistor NPD1, and the gates of the second pull-up transistor PPU2 and the second pull-down transistor NPD2 are connected to the source of the first gate transistor NPG1 to lead out the internal node P of the redundant memory unit.

The gate of the first gate transistor NPG1 is connected to the word line WL for responding to the driving of the test word line voltage WL_replicate that is preset.

The sources of the first pull-up transistor PPU1 and the second pull-up transistor PPU2 are connected to a power source VDD. The sources of the first pull-down transistor NPD1 and the second pull-down transistor NPD2 are connected to the ground VSS.

The drain of the first gate transistor NPG1 is connected to the first bit line BP. The drain of the second gate transistor NPG2 is connected to the second bit line BN. The first bit line BP and the second bit line BN are connected to a high electrical level.

The gates of the first pull-up transistor PPU1 and the first pull-down transistor NPD1, and the drains of the second pull-up transistor PPU2 and the second pull-down transistor NPD2 are connected to the source of the second gate transistor NPG2, and are further connected to a constant high signal TieH.

The gate of the second gate transistor NPG2 is connected to a constant low signal TieL.

As shown in FIG. 4, the connection manner of the redundant memory device 10 internally copied from a SRAM memory cell is another embodiment. The main purpose of the embodiment is to improve the stability of the redundant memory device 10 by connecting the constant high signal TieH and the constant low signal TieL.

In one embodiment, other connection manners of the redundant memory device 10 internally copied from a SRAM memory cell based on the concept of the present disclosure to determine whether the internal node P of the redundant memory unit has a read flip by the voltage signal Vout_SENSOR of the internal node P.

As shown in FIG. 2, corresponding to the specific case of the circuit structure for the word line voltage sensor applied in an adjustable WLUD read/write auxiliary circuit comprising a plurality of redundant memory devices 10, there may also be a plurality of decision devices 20 in the circuit structure.

The number of the decision devices 20 and the redundant memory devices 10 may be equal to each other to form a one-to-one correspondence. Each of the decision devices 20 is connected to the internal node P of the corresponding redundant memory device 10 for responding to the read operation and determining whether the test word line voltage WL_replicate causes the reversal of the internal node P of the redundant memory device 10 during the read operation.

Figure 5:
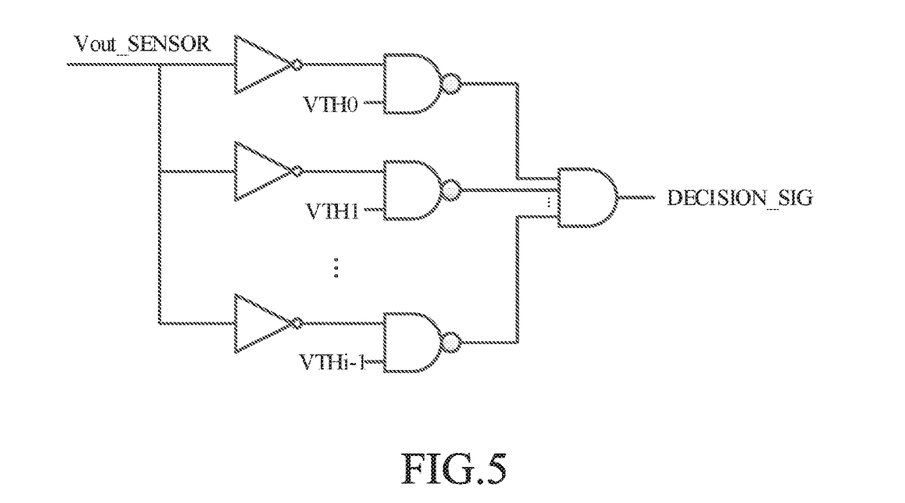
FIG. 5 shows a circuit of the decision device according to an embodiment of the present disclosure.

FIG. 5 shows the circuit of the decision device 20. The decision device 20 may comprise a combination of a plurality of inverters INV and a plurality of NAND gates. The P:N ratios of the inverters INV are different, and less than or equal to 2:1.

The inputs of the inverters INV are connected to the internal node P to receive the voltage signal Vout_SENSOR of the internal node P. The output of each inverter INV is connected to the first input of the corresponding NAND gate.

The second inputs of the NAND gates are configured to receive the determination reference signal VTH0-VTHi. One of the NAND gate outputs a determination result in response to receiving the corresponding determination reference signal VTH.

The inverting points of the inverters INV having different P:N size ratios are different. The P:N ratio of a certain inverter INV equalling 2:1 means that the inverter INV will invert when the voltage signal Vout_SENSOR of the internal node P reaches about ½ of the power source voltage VDD.

Correspondingly, the P:N ratio of other inverters INV less than 2:1 means that the inverters INV will invert when the input signal Vout_SENSOR is less than ½ of the power source voltage VDD, thereby further improving the determination accuracy of the decision device 20.

As shown in FIG. 5, the decision device 20 may gate the inverters INV having different P:N ratios by triggering the corresponding determination reference signals VTH0~VTHi, thereby generating corresponding determination result signals according to the specific P:N ratio.

In one embodiment, the decision device 20 comprising a plurality of inverters INV and a plurality of NAND gates is just an embodiment for providing a plurality of criteria for determining whether the internal node P has a read flip, thereby expanding the application scope of the circuit structure according to the embodiment. In other embodiments, the purpose of determining whether the internal node P has a read flip, even if the decision device 20 only comprises one inverter INV and one NAND gate.

In one embodiment, the circuit structure comprising a plurality of redundant memory devices 10 and a plurality of decision devices 20 is also an embodiment for determining whether the internal node P has a read flip in groups, thereby effectively reducing the need of inverters INV having different P:N ratios, and improving the determination accuracy of the circuit structure for the word line voltage sensor in disguised form. In other embodiments, one redundant memory device 10 and one decision device 20 to determine whether the internal node P of the redundant memory unit has a read flip according to the voltage signal Vout_SENSOR of the internal node P may be used.

According to the circuit structure in the present disclosure, in response to determining by the decision device 20 that the internal node P is reversed, the redundant memory device 10 may further perform another read operation after the downshift to simulate the read operation again by the downshift adjusted test word line voltage WL_replicate, until the decision device 20 determines that the internal Node P does not reverse during the read operation.

Corresponding to the embodiment of the circuit structure comprising a plurality of redundant memory devices 10 and a plurality of decision devices 20, a decision logic device 60 may be further provided following the decision devices 20.

The decision logic device 60 may be provided with a plurality of inputs, for respectively receiving a plurality of determination result signals DECISION_SIG output by the determination devices 20. In response to any one of the determination results DECISION_SIG determining that the internal node P is reversed, the decision logic device 60 outputs a logic determination result signal DEC_EN indicating the reversing of the internal node P.

In one embodiment, the decision logic device 60 is just a specific embodiment used to integrate the logic determination result signals DECISION_SIG output by the decision devices 20. In other embodiments, the decision logic device 60 may not be employed corresponding to the circuit structure comprising only one decision device 20.

Regarding the circuit structure for the word line voltage sensor applied in an adjustable WLUD read/write auxiliary circuit shown in FIG. 2, a debounce device 30 may also be provided.

Figure 6:
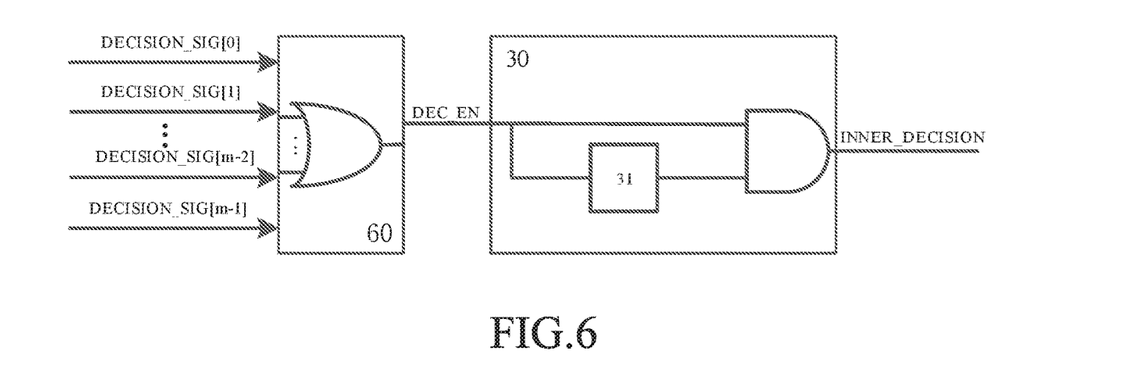
FIG. 6 shows a frame structure of the debounce device according to an embodiment of the disclosure.

As shown in FIG. 6, the debounce device 30 may comprise a delay unit 31 and an AND gate logic unit. The debounce device 30 may be connected after the decision logic device 60 to filter out the noise signal output by the decision logic device 60, thereby avoiding misoperations.

Referring to FIG. 6, the output signal of the delay unit is delayed from the logic determination result signal DEC_EN by a delay time.

When the decision logic device 60 generates a noise signal, the generated logic determination result signal DEC_EN should be a short-term glitch signal in high level (logic 1). The logic determination result signal DEC_EN will be reverted to zero (logic 0) when the noise signal is delayed by the delay unit 31. The output of the AND gate logic unit will remain low, thereby filtering the noise signal.

Correspondingly, when the decision logic device 60 responds to the determination result signal DECISION_SIG of the occurrence of a read flip (logic 1), the logic determination result signal DEC_EN generated at the output should be a voltage in high level (logic 1) that is longer than the delay time. The logic determination result signal DEC_EN delayed by the delay unit 31 may still trigger the AND gate logic unit with the voltage in high level (logic 1) at the output of the decision logic device 60, thereby generating an internal determination signal INNER_DECISION indicating the occurrence of a read flip. The delay time of the delay unit 31 is less than the duration of the high-level logic determination result signal DEC_EN.

In one embodiment, the debounce device 30 operating in response to the logic determination result signal DEC_EN is just an embodiment for filtering noise signals, thereby preventing false triggering and improving the reliability of the circuit structure. In other embodiments, the debounce device 30 may also operate in response to the determination result signal DECISION_SIG output by the determination device 20 to achieve the same purpose of filtering the noise signal, when the decision logic device 60 is not employed in the circuit structure. The basic operation of the circuit structure for the word line voltage sensor will not be affected even if not employed the debounce device 30.

According to the circuit structure for the word line voltage sensor applied in an adjustable WLUD read/write auxiliary circuit shown in FIG. 2, a selection device 40 such as a multiplexer may also be provided for selecting whether to use the internal determination signal INNER_DECISION or an external determination signal EXT_DECISION directly sent from the outside, thereby improving the control flexibility of the circuit structure.

Figure 7:
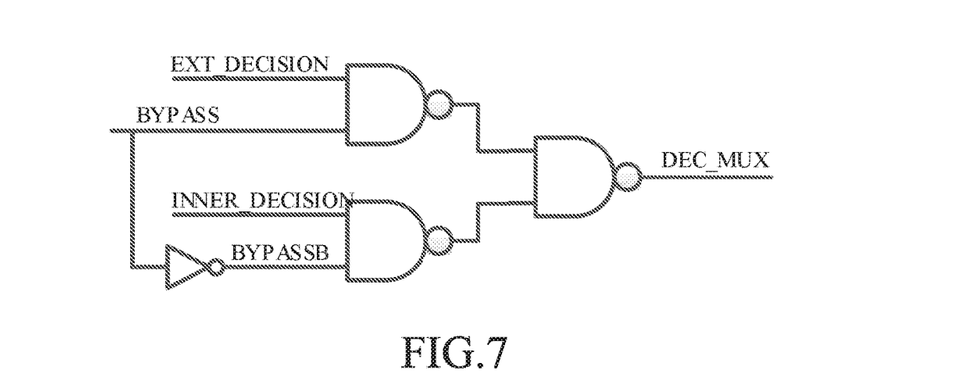
FIG. 7 shows a circuit of the selection device according to an embodiment of the present disclosure.

As shown in FIG. 7, the selection device 40 may comprise several NAND gate logic units for bypassing the internal determination signal INNER_DECISION in response to the bypass signal BYPASS, and transmitting the external determination signal EXT_DECISION input from the selection device 40 to the subsequent statistics device 50. The internal determination signal INNER_DECISION indicates the output result of the decision device 20.

Referring to FIG. 7, when the bypass signal BYPASS is at high level (logic 1), the NAND gate logic unit corresponding to the external determination signal EXT_DECISION is activated, while the NAND gate logic unit corresponding to the internal determination signal INNER_DECISION is standby. The selection result signal DEC_MUX output by the selection device 40 indicates the external determination signal EXT_DECISION.

Conversely, when the bypass signal BYPASS is at low level (logic 0), the NAND gate logic unit corresponding to the external determination signal EXT_DECISION is standby, while the NAND gate logic unit corresponding to the internal determination signal INNER_DECISION is activated. The selection result signal DEC_MUX output by the selection device 40 indicates the internal determination signal INNER_DECISION.

In one embodiment, the circuit connection manner of the selection device 40 shown in FIG. 7 is just a specific embodiment. In other embodiments, may also achieve the same selection effect by connecting the transistors in the manner shown in FIG. 8 or using the transfer gate and the NOT gate.

Figure 8:
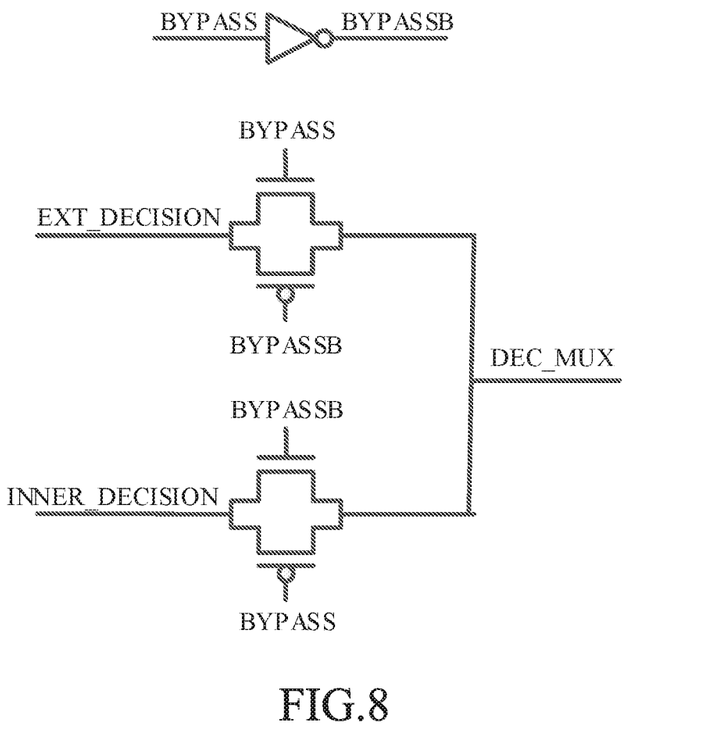
FIG. 8 shows a circuit of the selection device according to an embodiment of the present disclosure.

In one embodiment, the selection device 40 shown in FIG. 7 and FIG. 8 for bypassing the internal determination signal INNER_DECISION based on the bypass signal BYPASS is only an embodiment for providing a function of manually determining the read flip, thereby improving control flexibility and saving time. If the reduced WLUD gear that is required is known, BYPASS and EXT_DECISION may be used to generate a corresponding switch control signal SEL directly in the statistics device 50 instead of testing the gears that need to be shifted down by stepwise manner. In other embodiments, the decision device 20 may be configured to determine whether the internal node P is reversed, even if the selection device 40 is not employed. The gear need to be shifted down and the critical word line voltage may also be obtained by stepwise testing.

Regarding the circuit structure for the word line voltage sensor applied in an adjustable WLUD read/write auxiliary circuit shown in FIG. 2, a statistics device 50 may also be provided.

The statistics device 50 is configured to count and output the number of the inversions as determined by the decision device 20, thereby controlling the subsequent devices of the WLUD read auxiliary circuit to perform a corresponding word line downshift operation, and calculating the critical word line voltage. The number "n" of inversions indicates the gears that need to be downshifted, and is used to characterize the critical word line voltage in conjunction with the initial test word line voltage WL_replicate and the adjusting word line voltage ΔWL_replicate in each test. The critical word line voltage equals to WL_replicate−n× ΔWL_replicate.

Figure 9:
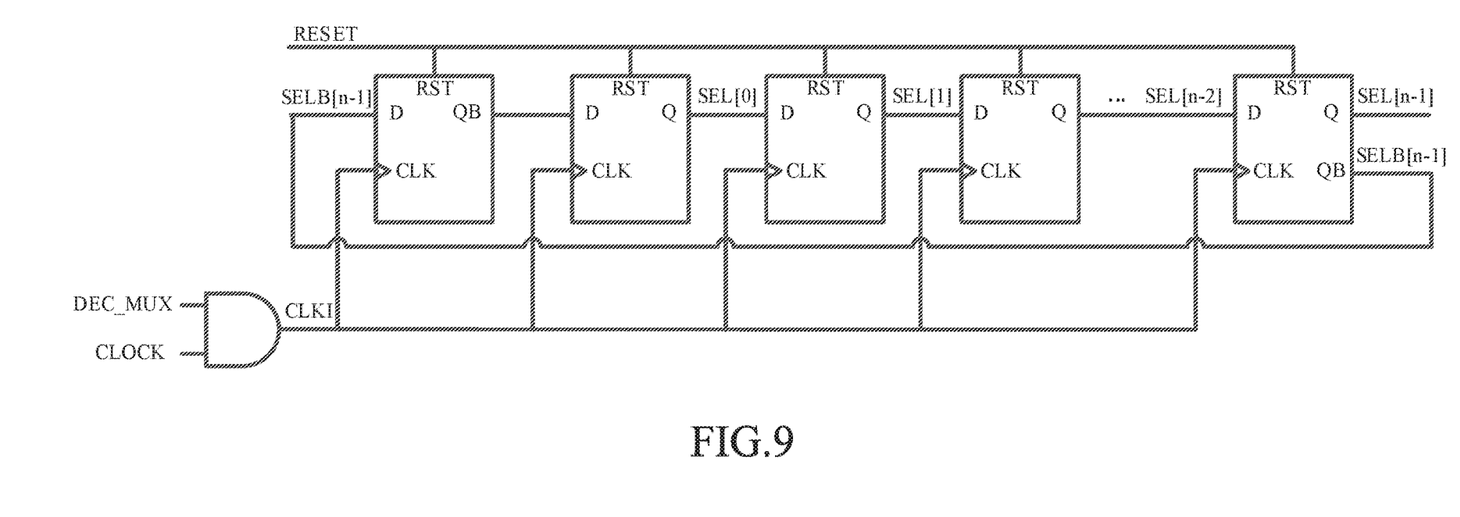
FIG. 9 shows a circuit of the statistics device according to an embodiment of the present disclosure.

FIG. 9 shows a circuit of the statistics device. The statistics device 50 may be a shift register sequential circuit consisting of at least one D flip-flop.

Referring to FIG. 9, the switch control signals SEL[0]-SEL[n−1] provided by the embodiment are all set 0 by virtue of the initial reset signal RESET provided in the circuit structure. Every time the selection result signal DEC_MUX acquired at the valid edge (rising edge or falling edge) of the clock signal CLOCK indicating a valid signal at high level, the switch control signals SEL[0]~SEL[n−1] are thereby sequentially shifted valid from low bit to high bit. The statistics device 50 outputs the corresponding switch control signals SEL[0]-SEL[n−1], when the decision device 20 determines that no inversion occurs. The switch control signals SEL[0]-SEL[n−1] with only one active (high level) bit indicate the number of inversions of the internal node P.

In one embodiment, the shift register sequential circuit consisting of a plurality of D flip-flops is just a specific embodiment for counting the reversals. In other embodiments, other specific solutions may also be employed to achieve the same counting purpose.

Figure 10:
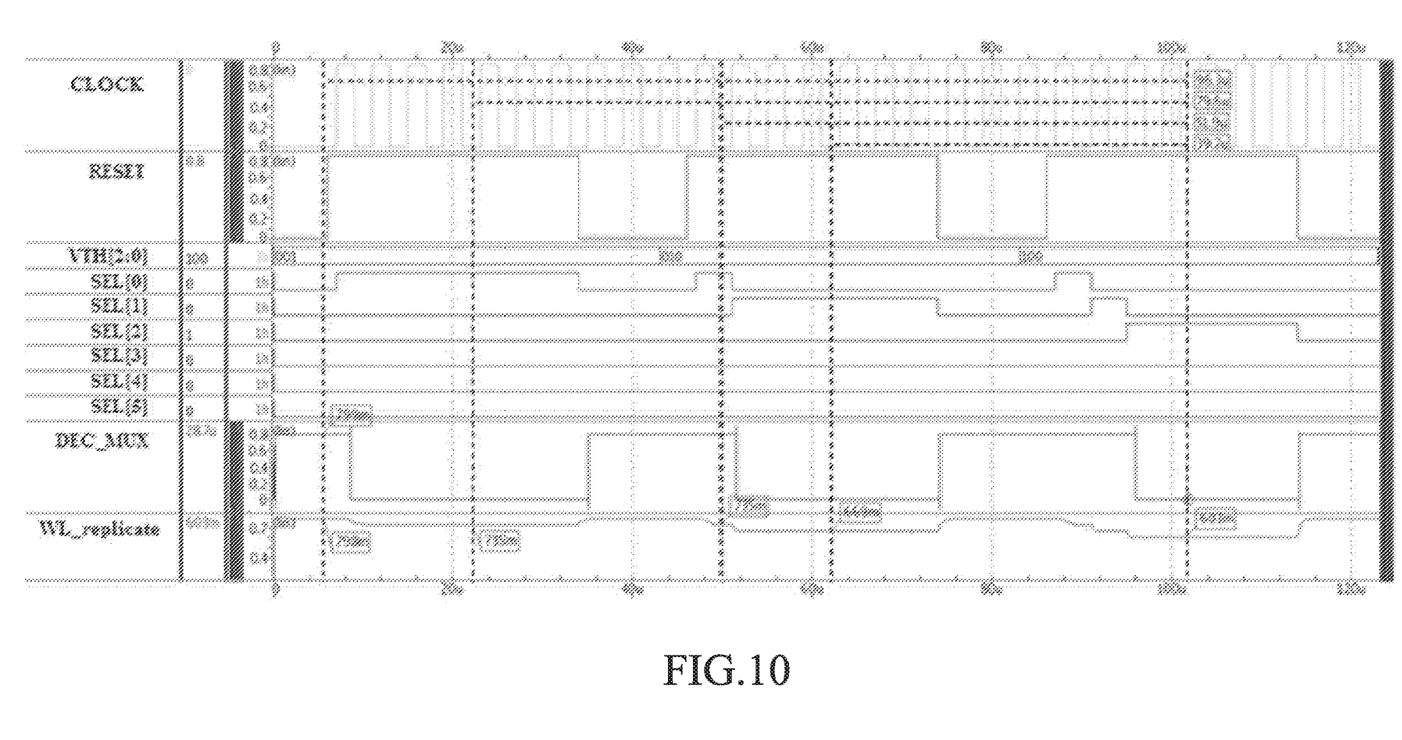
FIG. 10 shows a simulation waveform according to an embodiment of the present disclosure.

FIG. 10 shows a simulation waveform of the circuit structure. The abscissa of the simulated waveform diagram indicates the operating time of the circuit structure.

The value of the switch control signals SEL[0]-SEL[5] of the statistical device 50 are reset to 0 by the reset signal RESET, and then the clock signal CLOCK of the circuit structure is operated. All bits of the switch control signals SEL[0]-SEL[5] are now 0.

Then, the clock signal CLOCK of the circuit structure starts to operate. The selection result signal DEC_MUX is acquired at the rising edge of each clock signal CLOCK.

The high level (logic 1) of the selection result signal DEC_MUX indicates that the word line WL voltage may cause the internal node P to reverse. The statistics device 50 then carries one bit and transmits the switch control signal of SEL[0]=1 to the subsequent circuit devices (not shown) provided in the adjustable WLUD read auxiliary circuit to perform a downshift operation of the word line WL voltage and return an adjusted test word line voltage WL_replicate to the redundant memory device 10. The adjusted test word line voltage WL_replicate indicates the value of the word line WL voltage after the downshift operation. The adjusted test word line voltage WL_replicate may be obtained by lowering the initial test word line voltage by a certain ratio (for example, 10%) or by decreasing a certain voltage (for example, 0.1V).

Repeatedly perform the read operation by the redundant memory device 10 until the internal node P of the redundant memory device 10 is no longer read flipped by the adjusted test word line voltage WL_replicate. The internal node voltage Vout_SENSOR=0 is thereby output by the decision device 20.

Accordingly, when the selection result signal DEC_MUX turns to 0, the switch control signals SEL[0]-SEL[5] are no longer carried. The test word line voltage WL_replicate is thereby no longer reduced, meaning that the critical word line voltage capable of operating the SRAM in an optimum state is obtained.

In one embodiment, the circuit structure for the word line voltage sensor applied in an adjustable WLUD read auxiliary circuit that is provided in the embodiment, may indirectly detect the word line WL voltage applied to the gate of the transfer transistor in the SRAM memory cell, by detecting the internal node voltage Vout_SENSOR in a redundant memory device 10. The circuit structure may determine whether the downshift of the WLUD is required by a real-time determination of the occurrence of the read flip caused by the word line voltage applied on the gate of the current NPG transistor, and output the switch control signal SEL[0]-SEL[n−1] required by the downshift of word line voltage.

What is claimed is:

1. A circuit structure for obtaining a critical word line voltage to keep internal node of a SRAM memory cell stable during read operations, comprising:
   a redundant memory device, a decision device, a statistics device and a selection device, wherein:
   the redundant memory device is configured to simulate the read operation of the SRAM memory cell in response to the driving of a test word line voltage;
   the decision device is connected to an internal node of the redundant memory device, and configured to determine, according to the read operation, whether the test word line voltage causes a reversal of the internal node of the redundant memory device during the read operation, in response to the reversal, the redundant memory device simulates the read operation with adjusted test word line voltage until the decision device determines that the internal node does not reverse during the read operation;
   the statistics device is configured to count and output the number of reversals, which is used to characterize the critical word line voltage in conjunction with each adjustment of the test word line voltage; and
   the selection device is connected between the decision device and the statistics device, and configured to bypass the output result of the decision device, and transmits an external signal input by the selection device to the statistics device in response to a bypass signal; the statistics device counts and outputs the number of reversals according to the external signal.

2. The circuit structure of claim 1, wherein the redundant memory device comprises a plurality of redundant memory units, wherein
   each of the redundant memory units comprises electrical components that replicate the electrical components in the SRAM memory cell, wherein the connection relationship of the electrical components in the redundant memory unit is different from the connection relationship of the electrical components in the SRAM memory cell, and the internal node of the redundant memory device feeds back an average state of the internal nodes in the redundant memory units.

3. The circuit structure of claim 2, wherein each of the redundant memory units comprises a first gate transistor, a first pull-up transistor, a first pull-down transistor, a second gate transistor, a second pull-up transistor and a second pull-down transistor, which are connected between a first bit line and a second bit line;

the drains of the first pull-up transistor and the first pull-down transistor are connected to the source of the first gate transistor to lead out the internal node of the redundant memory unit;

the gates of the first gate transistor and the second gate transistor are connected to the word line for responding to the driving of the test word line voltage that is preset;

the drain of the first gate transistor is connected to the first bit line, and the drain of the second gate transistor is connected to the second bit line, wherein the first bit line and the second bit line are connected to a high level;

the gate and the source of the first pull-up transistor, the gate of the first pull-down transistor, the source and the drain of the second pull-up transistor, and the drain of the second pull-down transistor are connected to a power source; and the source of the first pull-down transistor, the gate of the second pull-up transistor, and the gate and the source of the second pull-down transistor are grounded.

4. The circuit structure of claim 2, wherein each of the redundant memory units comprises a first gate transistor, a first pull-up transistor, a first pull-down transistor, a second gate transistor, a second pull-up transistor and a second pull-down transistor which are connected between a first bit line and a second bit line;

the drains of the first pull-up transistor and the first pull-down transistor, the gates of the second pull-up transistor and the second pull-down transistor are connected to the source of the first gate transistor to lead out the internal node of the redundant memory unit;

the gate of the first gate transistor is connected to the word line for responding to the driving of the test word line voltage that is preset;

the sources of the first pull-up transistor and the second pull-up transistor are connected to a power source, and the sources of the first pull-down transistor and the second pull-down transistor are grounded;

the drain of the first gate transistor is connected to the first bit line, and the drain of the second gate transistor is connected to the second bit line, wherein the first bit line and the second bit line are connected to a high level;

the gates of the first pull-up transistor and the first pull-down transistor, and the drains of the second pull-up transistor and the second pull-down transistor are connected to the source of the second gate transistor, and are further connected to a constant high signal; and the gate of the second gate transistor is connected to a constant low signal.

5. The circuit structure of claim 1, wherein the decision device comprises inverter and NAND gate, wherein the P:N ratio of the inverter is less than or equal to 2:1, the input of the inverter is connected to the internal node, and the output of the inverter is connected to the first input of the NAND gate, in response to receiving a determination reference signal on the second input of the NAND gate, the output of the NAND gate outputs a determination result to the statistics device, so that the statistics device can count the reversals based on the determination result.

6. The circuit structure of claim 5, wherein the decision device comprises a combination of a plurality of inverters and a plurality of NAND gates, wherein the P:N ratios of the inverters are different, the inputs of the inverters are connected to the internal node, the output of each inverter is connected to the first input of the corresponding NAND gate, and the second inputs of the NAND gates are configured to receive the determination reference signal, in response to receiving the determination reference signal on one of the NAND gates, the output of the NAND gate outputs a determination result.

7. The circuit structure of claim 1, wherein the circuit structure comprises a plurality of the redundant memory devices and a plurality of the decision devices, each of the redundant memory devices corresponding to one of the decision devices;

the redundant memory devices emulate the read operation of the SRAM memory cell;

the decision devices output a plurality of determination results as to whether reversals occur; wherein the circuit structure further comprises a decision logic device for receiving the determination results, in response to any one of the determination results determining that the internal node is reversed, the decision logic device outputs a determination signal of the reversal to the statistics device, wherein the number of reversals is characterized by the number of occurrences of the determination signal of the reversals.

8. The circuit structure of claim 1, wherein the statistics device is a shift register sequential circuit consisting of a plurality of D flip-flops, wherein each time the decision device determining the reversal, the shift register sequential circuit sequentially shifts from low bit to high bit until the decision device determines that the internal node does not reverse, and then outputs the number of reversals.

9. The circuit structure of claim 1, further comprising a debounce device, wherein the debounce device comprises a delay unit and a logic unit, and is connected between the decision device and the statistics device to filter out the noise signal output by the decision device.

* * * * *